(12) United States Patent
Smick et al.

(10) Patent No.: US 6,274,875 B1
(45) Date of Patent: Aug. 14, 2001

(54) FLUID BEARING VACUUM SEAL ASSEMBLY

(75) Inventors: Theodore H. Smick, Essex; Marvin Farley, Ipswich; Takao Sakase, Rowley; Geoffrey Ryding, Manchester, all of MA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/293,941

(22) Filed: Apr. 19, 1999

(51) Int. Cl.[7] .............................. H01J 37/20; F16J 15/40
(52) U.S. Cl. .............................. 250/492.21; 250/441.11; 250/442.11; 277/913; 277/431; 384/131
(58) Field of Search .................. 250/492.21, 441.11, 250/442.11; 277/913, 927, 637, 431; 384/124, 134, 130

(56) References Cited

U.S. PATENT DOCUMENTS

| | | | |
|---|---|---|---|
| 4,118,042 | * 10/1978 | Booth | 277/226 |
| 4,726,689 | * 2/1988 | Pollock | 384/12 |
| 5,003,183 | 3/1991 | Nogami et al. | 250/492.2 |
| 5,229,615 | 7/1993 | Brune et al. | 250/492.2 |

FOREIGN PATENT DOCUMENTS

WO9913488  3/1999 (WO).

* cited by examiner

Primary Examiner—Jack Berman
(74) Attorney, Agent, or Firm—Boult Wade Tennant

(57) ABSTRACT

A fluid bearing vacuum seal assembly comprises an annular stator with first and second opposed surfaces, at least part of the first surface defining a first bearing surface. The stator also defines an aperture having a wall extending between the first and second surfaces. The assembly also comprises a rotor with first and second opposed surfaces, the second surface defining in part a second bearing surface which is supported relative to the first bearing surface in use so that the rotor is rotatable relative to the stator. A cylindrical wall projects axially from the second surface of the rotor through the aperture in the stator. An annular flange projects radially outwardly from the cylindrical wall adjacent to the second surface of the stator. At least one annular differential pumping channel is defined in each of the first and second surfaces of the stator and the wall which connects the first and second surfaces. This configuration allows the differential pumping channels to be spaced apart to a greater extent, improving the performance of the vacuum seal and allowing a better vacuum to be achieved.

15 Claims, 2 Drawing Sheets

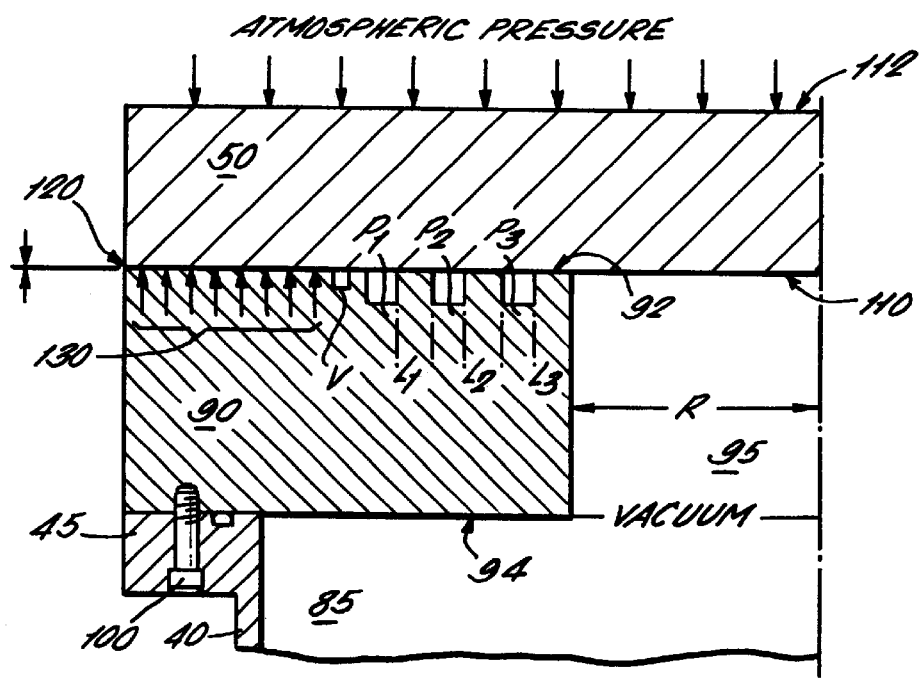

FLUID BEARING VACUUM SEAL ASSEMBLY

FIELD OF THE INVENTION

This invention relates to a fluid bearing vacuum seal assembly. The invention relates in particular to an ion implanter having such an assembly.

BACKGROUND OF THE INVENTION

As will be familiar to those skilled in the art, in a typical ion implanter a relatively small cross-section beam of dopant ions is scanned relate to a silicon wafer. Traditionally, a batch of wafers was mechanically scanned in two directions relative to a fixed direction ion beam.

With the advent of larger wafers, up to 300 mm in diameter, processing of a single wafer at a time has become advantageous in terms of cost, reduced wastage etc. Accordingly, it is now desirable to scan an ion beam relative to a silicon wafer by mechanically scanning the wafer in a first direction and electrostatically or electromagnetically scanning or fanning the ion beam in a second direction.

There are a number of different configurations of single wafer processing machines. One example is described in WO99/13488 and other configurations are described in U.S. Pat. Nos. 5,003,183 and 5,229,615. In WO99/13488, the wafer is mounted upon a substrate holder in a process chamber of an implantation device. Attached to, or integral with, the substrate holder is an arm which extends through an aperture in the wall of the vacuum chamber. Mechanical scanning is effected by a scanning mechanism located outside the process chamber. The scanning mechanism is connected with the arm of the substrate holder and allows movement of the arm and hence the substrate holder relative to the process chamber.

To facilitate movement of the moving parts of the scanning mechanism, one or more gas bearings are provided. For example, the end of the arm distal from the substrate support may be attached to a first bearing member which moves reciprocally relative to a second bearing member. This allows the wafer to be mechanically scanned in a plane orthogonal to the ion beam of the ion implanter. Movement of the first bearing member relative to the second bearing member is facilitated via a first gas bearing.

Likewise, the second bearing member may itself be rotatable relative to the process chamber to allow tilting of the substrate support relative to the direction of the ion beam. The second bearing member rotates against a stator mounted upon a flange adjacent the aperture in the wall of the process chamber; a second gas bearing is employed between the stator and the surface of the second bearing member to facilitate this rotation.

Since the process chamber is evacuated to a high vacuum and the exterior of the chamber is subject to atmospheric pressure, a large pressure differential exists across the second gas bearing. As is known in the art, in order to permit a vacuum to be maintained adjacent a gas bearing a series of differentially pumped channels are provided in one bearing surface. The vacuum which can be achieved in the process chamber depends on the gas flow leakage between adjacent channels. Thus, a greater vacuum can be achieved by increasing the distance between the channels. However, this also leads to an increase in the outside diameter of the bearing and greater vacuum forces on the movable part of the bearing.

It is an object of the present invention to address this problem. More generally, it is an object of the invention to provide an improved differentially pumped gas bearing vacuum seal assembly.

SUMMARY OF THE INVENTION

These and other objects are achieved by the provision of an apparatus comprising: an annular stator having first and second opposed surfaces, at least part of the first surface defining a first bearing surface, the stator also defining an aperture having a wall extending between the first and second opposed surfaces; a rotor having first and second opposed surfaces, the second surface defining in part a second bearing surface supported relative to the first bearing surface so that the rotor is rotatable relative to the stator; a cylindrical wall projecting axially from the second surface of the rotor through the aperture of the stator; an annular flange projecting radially outwardly from the cylindrical wall adjacent the second surface of the stator; and at least one annular channel defined in each of the first and second surfaces of the stator and the wall of the stator.

Preferably the stator is spaced from the rotor, in use, by a fluid bearing layer.

Typically the spacing between the first and second bearing surfaces, in use, may be in the range of about 10 $\mu$m to 15 $\mu$m.

The spacing between the second surface of the stator and the annular flange, in use, may be in the range of about 10 $\mu$m to about 30 $\mu$m.

The spacing between the cylindrical wall and the wall of the stator is substantially greater than the spacing between the first and second bearing surfaces and between the second surface of the stator and the flange.

Preferably, the channel defined in the wall of the stator has a substantially greater cross section than that of the channels defined in the first and second surfaces of the stator.

Conveniently, the fluid of said fluid bearing layer is compressed air.

In another aspect of the invention there is provided an ion implanter comprising: an ion beam generator to generate a beam of ions to be implanted; a process chamber into which the ion beam is directed; an annular stator mounted upon the process chamber, the stator having first and second opposed surfaces, at least part of the first surface defining a first bearing surface and the stator also defining an aperture having a wall extending between the first and second surfaces; a rotor having first and second opposed surfaces, the second surface defining in part a second bearing surface supported relative to the first bearing surface so that the rotor is rotatable relative to the stator; a cylindrical wall projecting axially from the second surface of the rotor through the aperture defined by the stator; an annular flange projecting radially outwardly from the cylindrical wall adjacent the second surface of the stator; and at least one annular channel defined in each of the first and second surfaces of the stator and the wall of the stator.

BRIEF DESCRIPTION OF THE DRAWINGS

The invention may be put into practice in a number of ways, one embodiment of which will now be described by way of example only and with reference to the accompanying figures in which:

FIG. 2 shows a sectional view along the line A—A in the process chamber of FIG. 1, the process chamber including prior art apparatus; and FIG. 3 shows a sectional view along the line A—A of the process chamber of FIG. 1, the process chamber including apparatus according to a preferred embodiment of the present invention.

DESCRIPTION OF THE PREFERRED EMBODIMENT

Figure 1:
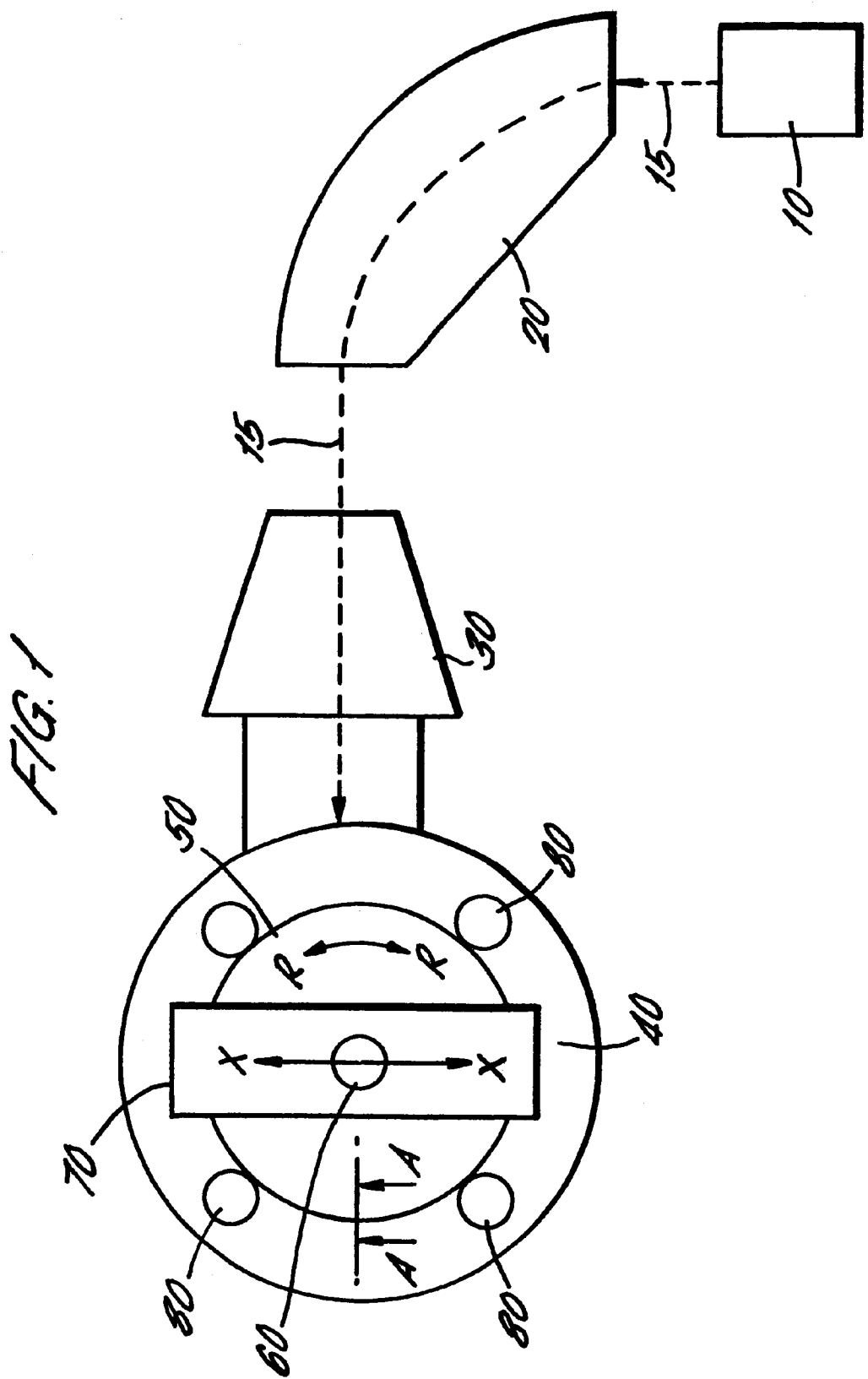
FIG. 1 shows a schematic side view of an ion implanter including a process chamber.

Referring first to FIG. 1, a schematic side view of an ion implanter is shown. The ion implanter includes an ion source 10 which is arranged to generate a (typically collimated) ion beam 15. The ion beam 15 is directed into a mass analyser 20 where ions of a desired mass/charge ratio are selected electromagnetically. Such techniques are well-known to those skilled in the art and will not be detailed further.

The ion beam 15 exits the mass analyser 20 in a generally collimated stream. The ion beam exiting the mass analyser may be subject to electrostatic acceleration or deceleration of the ions, depending upon the type of ions to be implanted and the desired implantation depth.

Downstream of the mass analyser is a process chamber 40 containing a wafer to be implanted. In the present embodiment, the wafer is typically a large single wafer, approximately 300 mm in diameter.

The ion beam which exits the mass analyser 20 generally has a beam width and height which is substantially smaller than the diameter of the wafer to be implanted. It is for this reason that the beam needs to be scanned relative to the wafer. In the preferred embodiment, the ion beam is scanned electrostatically or electromagnetically in the first plane via an electrostatic/electromagnetic scanner 30. In the present example, the ion beam is scanned in a single plane which extends into and out of the page when viewing FIG. 1. The wafer itself is scanned mechanically in a second direction orthogonal to the direction of scanning of the ion beam. To scan the wafer mechanically, the wafer is mounted upon a substrate support. This consists of a plate onto which the wafer is mounted within the process chamber 40, and an elongate arm connected to the plate.

The elongate arm extends out through the wall of the process chamber in a direction generally parallel with the scanning plane of the ion beam. The arm passes through a slot (not shown) in a rotor plate 50 which is mounted adjacent to a side wall of the process chamber 40. The end 60 of the scanning arm is mounted within a scanning member 70. To effect mechanical scanning of the scanning arm (and hence the wafer mounted upon the plate) relative to the electrostatically/electromagnetically scanned ion beam, the scanning member 70 is movable in a reciprocating manner in the direction X shown in FIG. 1. To facilitate this scanning, the undersurface of the scanning member 70 is spaced from the upper surface of the rotor plate 50 by a cushion of compressed air which acts as an air bearing.

The scanning member 70 in FIG. 1 is shown in a vertical position such that the surface of the wafer is perpendicular to the plane of the scanned or fanned instant ion beam. However, it may desirable to implant ions from the ion beam into the wafer at an angle. For this reason, the rotor plate 50 is rotatable about an axis defined through its centre, relative to the fixed wall of the process chamber 40. In other words, the rotor plate 50 is able to rotate in the direction R shown in FIG. 1.

As with the scanning member 70, movement of the rotor plate 50 relative to the wall of the process chamber is facilitated with an air bearing which lies between the lower surface of the rotor plate 50 and the upper surface of a stator (not shown in FIG. 1) mounted upon a flange extending from a wall of the process chamber 40. Radial movement of the rotor plate is constrained by a series of guide wheels 80 arranged around the circumference of the rotor plate 50. Unwanted axial movement of the rotor plate is prevented in use by the pressure differential between the two faces of the rotor plate. In particular, the inside of the process chamber is evacuated to prevent contamination of the wafer and ion beam and a large force due to atmospheric pressure accordingly acts to hold the rotor plate against the stator.

The mechanical scanning arrangement described above is that described in the aforementioned WO99/13488, assigned to a common assignee, the contents of which are hereby incorporated in their entirety by reference.

Referring now to FIG. 2, a sectional view along the line A—A of the process chamber 40 of FIG. 1 is shown, in the case where the rotor plate and stator are mounted upon a flange extending from the wall of the process chamber 40 using a prior art arrangement.

The wall of the process chamber 40 has a generally circular aperture (indicated by reference numeral 85 in FIG. 2) in it. An annular flange 45 extends around the edge of the circular aperture 85 in the wall of the process chamber 40. An annular stator 90, whose purpose will be described below, having an aperture 95 defined by a wall 93, is affixed to the flange 45, the stator 90 and aperture 95 being substantially coaxial with the axis of the circular aperture 85. Fixing of the stator 90 to the flange 45 is achieved by a mounting fastener 100, such as a bolt. This passes through an opening in the flange 45 and into a corresponding threaded opening in a lower surface of the stator 90. It will be understood that, in order to effect clamping of the stator 90 to the flange 45, a plurality of mounting fasteners 100 are employed about the circumference of the flange.

The rotor plate 50 lies above an upper surface (as viewed in FIG. 2)of the stator 90. The rotor plate 50 acts as a closure for the process chamber 40. The lower surface 110 (as viewed in FIG. 2) of the rotor plate 50 acts as a first bearing surface, and the upper surface 92 of the stator 90 acts as a second bearing surface. A supply of compressed air (not shown in FIG. 2) is connected to a series of compressed air channels in the stator 90 which are indicated schematically by arrows 130 in FIG. 2. Application of compressed air to the compressed air channels 130 creates a compressed air bearing 120 between the bearing surfaces 110,92 of the rotor plate 50 and the stator 90.

The process chamber 40 is evacuated. The upper surface 112 of the rotor plate 50 is, however, at atmospheric pressure. To allow rotational movement of the rotor plate 50 relative to the stator 90 on the compressed air bearing 120, whilst maintaining a vacuum within the process chamber 40, a vent V to atmosphere and a series of differential pumping channels P1,P2,P3 are provided. The channels allow a graded pressure differential to be obtained between a first differential pumping channel P1, which is at relatively close to atmospheric pressure, and a last differential pumping channel P3 which is at high vacuum.

The ultimate vacuum which can be achieved within the process chamber 40 is determined by the gas flow between each of the differential pumping channels P1,P2 and P3. The gas flow is a function of the gap G between the rotor plate 50 and the stator 90 and the distances L1 and L2 between the channels P1,P2,P3 and the distance L3 between the channel P3 and the aperture 95. For a given gap G, the vacuum performance is improved if the distances L1–L3 can be increased. However, as these distances are increased, the outside diameter of the stator 90 and rotor plate 50 and the vacuum forces on the rotor plate 40 also increase. When this happens, the rotor plate 50 may be subject to distortion due to the pressure differential across it arising from the vacuum within the chamber 40 and this may bring the bearing surface 110 of the rotor plate 50 parallel out of alignment with the bearing surface 92 of the stator 90. This in turn requires the gap G to be increased to ensure the bearing surfaces 92,110 do not contact each other which, as mentioned above, increases the gas flow between the pumping channels P1,P2,P3 and requires a greater pressure of compressed air to be supplied to create the gas bearing 120.

Alternatively, if the outside diameter of the stator 90 and rotor plate 50 is fixed then increasing the distances L1–L3 reduces the radius R of the aperture 85.

Turning now to FIG. 3, a section along the line A—A of the process chamber of FIG. 1 is shown, with an apparatus embodying the present invention employed. Features common to FIGS. 2 and 3 are labelled with like reference numerals.

In accordance with the present invention, a tube 140 is secured to the lower surface 110 of the rotor plate 50 and extends through the aperture 95 defined by the stator 90. A ring 150 is secured to the lower end of the tube 140, to create a flange which projects radially outwardly beneath the lower surface 94 of the stator 90. The length of the tube 140 is very precisely dimensioned so as to provide a given gap G2 between the lower surface 94 of the stator 90 and the upper surface of the ring 150 when the gas bearing 120 is in operation to provide a given gap G1 between the bearing surface 92 of the stator 90 and the bearing surface 110 of the rotor plate 50. Typically, G1 is in the order of 10–15 $\mu$m while G2 is in the order of 10–30 $\mu$m.

Furthermore, in the arrangement of the present invention the first differential pumping channel P1 is provided in the upper surface 92 of the stator 90. The second differential pumping channel P2 is provided in the wall 93 joining the upper and lower surfaces 92,94 of the stator 90, facing radially inwardly. The third differential pumping channel P3 is provided in the lower surface 94 of the stator 90. As shown, the second differential pumping channel P2 has a considerably larger cross section than the first and third differential pumping channels P1 and P3. The gap G3 between the wall 93 of the stator 90 and the radially outer surface 142 of the tube 140 is also relatively large compared with the gaps G1 and G2 so as to take account of differential expansion problems of the various components.

It will be appreciated if the arrangement of the present invention allows the spacing between the differential pumping channels to be increased to considerably larger values than in the prior art arrangement of FIG. 2, without the need to increase the outside diameter of the stator 90 and rotor plate 50. Thus for a given outside diameter the radius R of the aperture 95 can be maximised.

Additionally, the tube 140 and ring 150 serve to educe the ingress of contaminants such as particulate matter into the gap between the bearing surfaces 92,110.

An embodiment of the invention has been described in connection with the rotor plate arranged to rotate upon an air bearing above a stator which is in turn mounted upon a flange in an ion implanter. However, it will be appreciated that the invention may be employed in other situations in which a vacuum seal is required adjacent a gas bearing between two relatively rotatable parts. Indeed, the invention is not restricted to ion implanters and may be useful in other situations involving a vacuum chamber and a gas bearing between adjacent components.

Similarly, although the embodiment described uses compressed air in the gas bearing, any suitable fluid may be used.

Although the present invention has been described with reference to a preferred embodiment, those skilled in the art will recognise that changes may be made in form and detail without departing from the spirit and scope of the invention, which is to be determined in accordance with the appended claims.

What is claimed is:

1. A fluid bearing vacuum seal assembly comprising:
    an annular stator having first and second opposed surfaces, at least part of said first surface defining a first bearing surface, said stator also defining an aperture having a wall extending between the first and second opposed surfaces;
    a rotor having first and second opposed surfaces, said second surface defining in part a second bearing surface supported relative to said first bearing surface in use so that the rotor is rotatable relative to said stator;
    a cylindrical wall projecting axially from said second surface of said rotor through said aperture of said stator; and
    an annular flange projecting radially outwardly from said cylindrical wall adjacent said second surface of said stator; and
    at least one annular differential pumping channel defined in each of said first and second surfaces of said stator and said wall of said stator.

2. An apparatus as claimed in claim 1, wherein said stator is spaced from said rotor, by a fluid bearing layer.

3. An apparatus as claimed in claim 2, wherein the spacing between said first and second bearing surfaces, in use, is in the range of about 10 $\mu$m to 15 $\mu$m.

4. An apparatus as claimed in claim 3, wherein the spacing between said second surface of said stator and said annular flange, in use, is in the range of about 10 $\mu$m to about 30 $\mu$m.

5. An apparatus as claimed in claim 4, wherein the spacing between said cylindrical wall and said wall of said stator is substantially greater than said spacing between said first and second bearing surfaces and between said second surface of said stator and said flange.

6. An apparatus as claimed in claim 1, wherein said channel defined in said wall of said stator has a substantially greater cross section than that of said channels defined in said first and second surfaces of said stator.

7. An apparatus as claimed in claim 1, wherein the fluid of said fluid bearing layer is compressed air.

8. An ion implanter comprising:
    an ion beam generator to generate a beam of ions to be implanted;
    a process chamber into which the ion beam is directed;
    an annular stator mounted upon the process chamber, said stator having first and second opposed surfaces, at least part of said first surface defining a first bearing surface and said stator also defining an aperture having a wall extending between said first and second surfaces;
    a rotor having first and second opposed surfaces, the second surface defining in part a second bearing surface supported relative to said first bearing surface so that the rotor is rotatable relative to said stator;
    a cylindrical wall projecting axially from said second surface of said rotor through said aperture defined by said stator;
    an annular flange projecting radially outwardly from said cylindrical wall adjacent said second surface of said stator; and at least one annular channel defined in each of said first and second surfaces of said stator and said wall of said stator.

9. An ion implanter as claimed in claim 8, wherein said stator is spaced from said rotor, in use, by a fluid bearing layer.

10. An ion implanter as claimed in claim 9, wherein the spacing between said first and second bearing surfaces, in use, is in the range of about 10 μm to 15 μm.

11. An ion implanter as claimed in claim 10, wherein the spacing between said second surface of said stator and said annular flange, in use, is in the range of about 10 μm to about 30 μm.

12. An ion implanter as claimed in claim 11, wherein the spacing between said cylindrical wall and said wall of said stator is substantially greater than said spacing between said first and second bearing surfaces and between the second surface of said stator and said flange.

13. An ion implanter as claimed in claim 8, said channel defined in said wall of said stator has a substantially greater cross section than that of said channels defined in said first and second surfaces of said stator.

14. An ion implanter as claimed in claim 8, wherein the fluid of said fluid bearing layer is compressed air.

15. A fluid bearing vacuum seal assembly comprising:

an annular stator having first and second opposed surfaces, at least part of said first surface defining a first bearing surface, said stator also defining an aperture having a wall extending between the first and second opposed surfaces;

a rotor having first and second opposed surfaces, said second surface defining in part a second bearing surface supported relative to said first bearing surface in use so that the rotor is rotatable relative to said stator;

means projecting axially from said second surface of said rotor through said aperture adjacent said wall stator and projecting radially outwardly adjacent said second surface of said stator, said means defining an extension of said second surface of said rotor; and at least one annular differential pumping channel defined in each of said first and second surfaces of said stator and said wall of said stator.

* * * * *